(12) United States Patent
Hong et al.

(10) Patent No.: US 12,048,217 B2
(45) Date of Patent: Jul. 23, 2024

(54) DISPLAY DEVICE

(71) Applicant: Samsung Display Co., Ltd., Yongin-Si (KR)

(72) Inventors: Jongbeom Hong, Seongnam-si (KR);
Reehyang Kim, Hwaseong-si (KR);
Yongsub Shim, Gwangmyeong-si (KR);
Youngjun Yoo, Goyang-si (KR);
Junghwan Yi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 442 days.

(21) Appl. No.: 17/521,154

(22) Filed: Nov. 8, 2021

(65) Prior Publication Data
US 2022/0190057 A1    Jun. 16, 2022

(30) Foreign Application Priority Data

Dec. 14, 2020   (KR) ........................ 10-2020-0174651

(51) Int. Cl.
*H10K 59/35*  (2023.01)
*H10K 50/84*  (2023.01)
*H10K 50/86*  (2023.01)
*H10K 59/122* (2023.01)

(52) U.S. Cl.
CPC .......... *H10K 59/353* (2023.02); *H10K 50/84* (2023.02); *H10K 50/865* (2023.02); *H10K 59/122* (2023.02); *H10K 59/352* (2023.02)

(58) Field of Classification Search
CPC .... H10K 59/353; H10K 59/121; H10K 50/84; H10K 50/865; H10K 59/122; H10K 59/352; H10K 59/12; H10K 59/123; H10K 59/35; H10K 50/844
See application file for complete search history.

(56) References Cited

U.S. PATENT DOCUMENTS

2022/0216272 A1*   7/2022   Zhang ................. H10K 59/352

FOREIGN PATENT DOCUMENTS

KR    1020140075061 A    6/2014
KR    1020180135342 A    12/2018

* cited by examiner

*Primary Examiner* — Donald L Raleigh
(74) *Attorney, Agent, or Firm* — CANTOR COLBURN LLP

(57) ABSTRACT

A display device may include a substrate including a plurality of first areas and a plurality of second areas adjacent to the first areas, a pixel defining layer, and a light blocking layer. The pixel defining layer is disposed on the substrate. The pixel defining layer defines a plurality of first openings positioned in each of the first areas and a plurality of second openings positioned in each of the second areas. The light blocking layer is disposed in each of the second areas on the substrate and surrounds the second openings in the plan view. An area of each of the second openings may be larger than an area of each of the first openings in the plan view.

20 Claims, 9 Drawing Sheets

DISPLAY DEVICE

This application claims priority to Korean Patent Application No. 10-2020-0174651, filed on Dec. 14, 2020, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device including a light blocking layer.

2. Description of the Related Art

A flat panel display ("FPD"), which has an easy large area and may be thin and lightweight, has been widely used as a display device. As the flat panel display, a liquid crystal display ("LCD"), a plasma display panel ("PDP"), an organic light emitting display ("OLED"), and the like are used.

Meanwhile, a display device operating in a private mode has been proposed that uses a private film to deliver an image to only a user without delivering an image to nearby people. In the private mode, the private film is used to block light traveling to the lateral and only pass light traveling to the front, so that only users excluding people around the users may perceive an image.

SUMMARY

Embodiments provide a display device including a light blocking layer.

A display device according to an embodiment includes a substrate including a plurality of first areas and a plurality of second areas adjacent to the first areas, a plurality of first light emitting structures, a plurality of second light emitting structures, and a light blocking layer. The first light emitting structures are disposed in each of the first areas on the substrate and define a plurality first light emitting pixels in a plan view. Each of the first light emitting structures includes a first lower electrode, a first upper electrode disposed on the first lower electrode, and a first light emitting layer disposed between the first lower electrode and the first upper electrode. The second light emitting structures are disposed in each of the plurality of second areas on the substrate and define a plurality second light emitting pixels in the plan view. Each of the second light emitting structures includes a second lower electrode, a second upper electrode disposed on the second lower electrode, and a second light emitting layer disposed between the second lower electrode and the second upper electrode. The light blocking layer is disposed in each of the second areas on the substrate and surrounds the second light emitting pixels in the plan view. An area of a second light emitting pixel among the second light emitting pixels is larger than an area of a first light emitting pixel among the first light emitting pixels and which emits light of the same color as the second light emitting pixel in the plan view.

In an embodiment, the first areas and the second areas may be alternately arranged in one direction.

In an embodiment, each of the first and second light emitting pixels may include a red light emitting pixel which emits red light, a green light emitting pixel which emits green light; and a blue light emitting pixel which emits blue light.

In an embodiment, the display device may be driven in a sharing mode in which the first and second light emitting pixels simultaneously emit light, or in a private mode in which the second light emitting pixels emit light.

In an embodiment, the first light emitting pixels may be repeatedly arranged in a row direction and a column direction, and the second emitting pixels may be repeatedly arranged in the row direction and the column direction.

In an embodiment, a shape of each of the first light emitting pixels and a shape of each of the second light emitting pixels may be the same in the plan view.

In an embodiment, each of the first the first and second light emitting pixels may have a rhombus shape in the plan view.

In an embodiment, a shape of each of the first light emitting pixels and a shape of each of the second light emitting pixels may be different from each other in the plan view.

In an embodiment, each of the first light emitting pixels may have a rhombus shape in the plan view. Each of the second light emitting pixels may have a rectangular shape in the plan view.

In an embodiment, second blue light emitting pixels among the second light emitting pixels and which emit blue light may be disposed in a first column of each of the second areas in the plan view. Second red light emitting pixels which emit red light and second green light emitting pixels which emit green light, among the second light emitting pixels, may be alternately disposed in a second column of each of the second areas in the plan view.

In an embodiment, each of the second light emitting pixels may have the same-sized rectangular shape in the plan view. The second light emitting pixels may be sequentially arranged in one direction in the plan view.

In an embodiment, the display device may further include an encapsulation layer disposed on the first and second upper electrodes and a protective member disposed on the encapsulation layer.

In an embodiment, the light blocking layer may be disposed on the encapsulation layer in each of the second areas.

In an embodiment, the display device may further include a light blocking member disposed on the protection member in each of the second areas.

In an embodiment, the light blocking member may be divided into a blocking area which blocks light in a lateral direction and a transmission area which transmits light in a front direction.

A display device according to an embodiment includes a substrate including a plurality of first areas and a plurality of second areas adjacent to the first areas, a pixel defining layer, and a light blocking layer. The pixel defining layer is disposed on the substrate. The pixel defining layer defines a plurality of first openings positioned in each of the first areas and a plurality of second openings positioned in each of the second areas. The light blocking layer is disposed in each of the second areas on the substrate and surrounds the second openings in the plan view. An area of each of the second openings may be larger than an area of each of the first openings in the plan view.

In an embodiment, the first areas and the second areas may be alternately arranged in one direction.

In an embodiment, a first light emitting layer which emits one of red, green, and blue lights may be disposed in each of the first openings. A second light emitting layer which emits light of the same color as the first light emitting layer may be disposed in each of the second openings.

In an embodiment, the display device may be driven in a sharing mode in which the first light emitting layer and the second light emitting layer simultaneously emit light, or in a private mode in which the second light emitting layer emits light.

In an embodiment, the first openings may be repeatedly arranged in a row direction and a column direction, and the second openings may be repeatedly arranged in the row direction and the column direction.

In display device of the present invention, a light blocking layer may be disposed in a second area of a display area. In addition, an area of a second light emitting pixel disposed in the second area of the display area may be larger than an area of a first light emitting pixel disposed in the first area of the display area and emitting light of the same color as the second light emitting pixel. Accordingly, the luminance lifetimes of the first light emitting pixel and the second light emitting pixel may be substantially, equally maintained.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
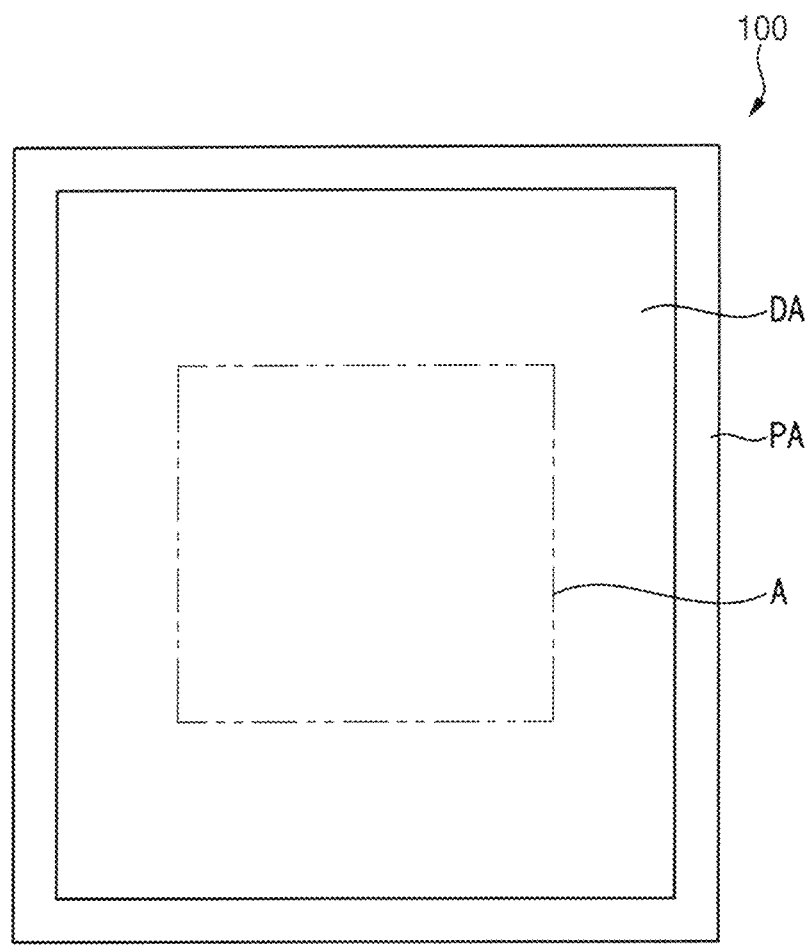
FIG. 1 is a plan view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "a first component", "a first region", "a first layer" or "a first section" discussed below could be termed "a second element", "a second component", "a second region", "a second layer" or "a second section" without departing from the teachings herein.

The terminology used herein is for the purpose of describing particular embodiments only and is not intended to be limiting. As used herein, the singular forms "a," "an," and "the" are intended to include the plural forms, including "at least one," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, embodiments of the present disclosure will be explained in detail with reference to the accompanying drawings. The same reference numerals are used for the same components in the drawings, and redundant descriptions of the same components will be omitted.

Figure 2:
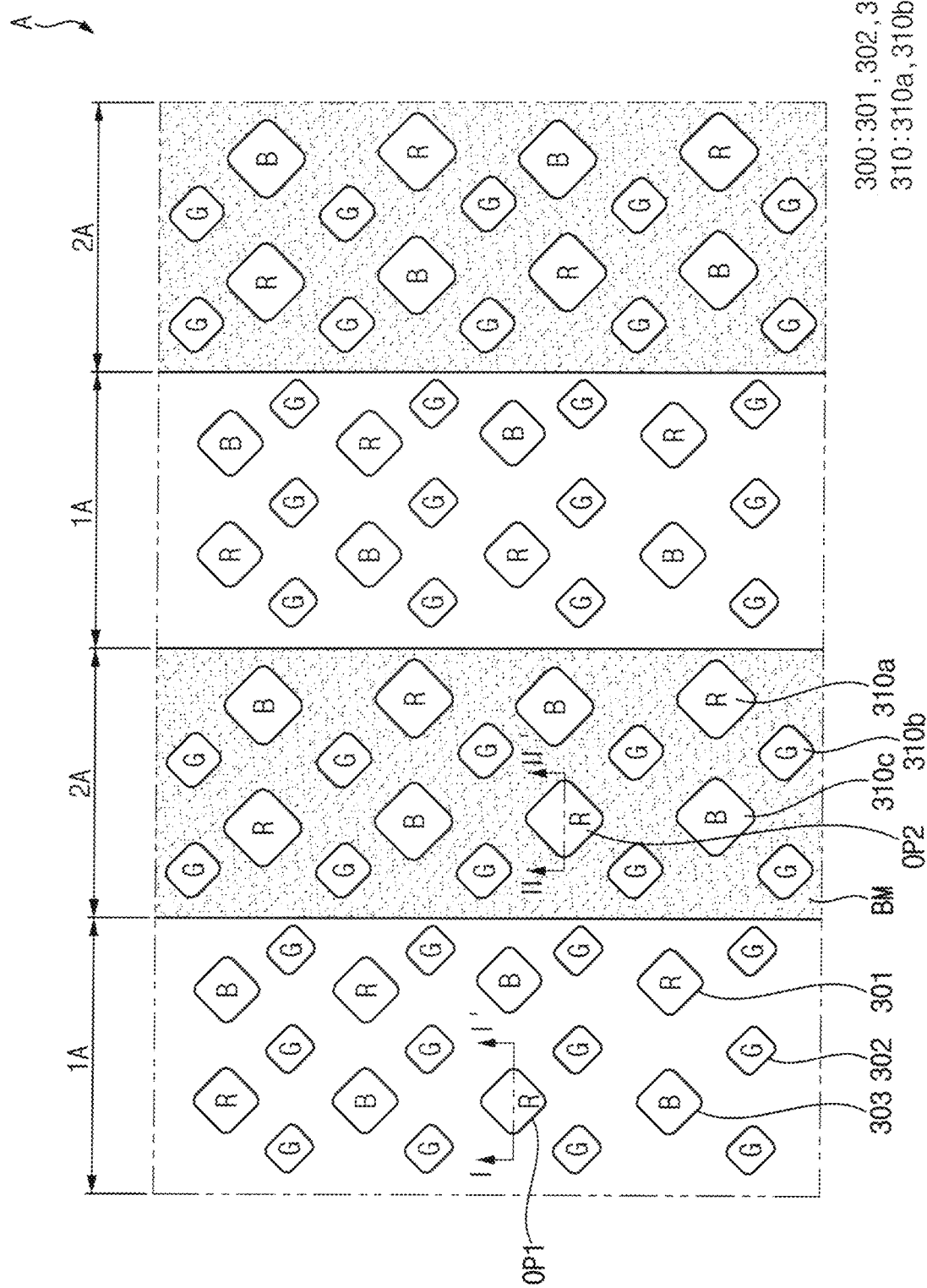
FIG. 2 is a plan view illustrating an enlarged view of area "A" of FIG. 1.

FIG. 1 is a plan view illustrating a display device according to an embodiment. FIG. 2 is a plan view illustrating an enlarged view of area "A" of FIG. 1.

Referring to FIGS. 1 and 2, the display device 100 may include a display area DA and a peripheral area PA adjacent to the display area DA. The peripheral area PA may surround at least a part of the display area DA.

In an embodiment, the display area DA may be divided into a plurality of first areas 1A and a plurality of second areas 2A. The first areas 1A and the second areas 2A may be alternately arranged in one direction (i.e., row direction). For example, one of the second areas 2A may be positioned between the two adjacent first areas 1A among the first areas 1A.

A plurality of first light emitting pixels 300 may be disposed in each of the first areas 1A of the display area DA. A plurality of second light emitting pixels 310 may be disposed in each of the second areas 2A of the display area DA. The first light emitting pixels 300 may include at least one first red light emitting pixels 301 emitting red light, at least one first green emitting pixels 302 emitting green light, and at least on first blue light emitting pixels 303 emitting blue light. The second light emitting pixels 310 may include at least one second red light emitting pixels 310a emitting red light, at least one second green light emitting pixels 310b emitting green light, and at least one second blue light emitting pixels 310c emitting blue light.

In an embodiment, the first light emitting pixels 300 may be repeatedly arranged in a row direction and a column direction in each of the first areas 1A of the display area DA The row direction may be the one direction in which the first areas 1A and the second areas 2A may be alternately arranged, and the column direction may intersect the row direction.

In an embodiment, for example, the first red light emitting pixels 301 and the first blue light emitting pixels 303 may be repeatedly disposed in a first row of the first area 1A, and the first green light emitting pixels 302 may be repeatedly disposed in a second row of the first area 1A. In addition, the first blue light emitting pixels 303 and the first red light emitting pixels 301 may be repeatedly disposed in a third row of the first area 1A, and the first green light emitting pixel 302 may be repeatedly disposed in a fourth row of the first area 1A. The first green light emitting pixels 302 may be repeatedly disposed in a first column of the first area 1A, and the first red light emitting pixels 301 and the first blue light emitting pixels 303 may be repeatedly disposed in a second column of the first area 1A. In addition, the first green light emitting pixels 302 may be repeatedly disposed in a third column of the first area 1A, the first blue light emitting pixel 303 and the first red light emitting pixel 301 may be repeatedly disposed in a fourth column of the first area 1A, and the first green light emitting pixels 302 may be repeatedly disposed in a fifth column of the first area 1A.

In an embodiment, in the same manner as the first light emitting pixels 300, the second light emitting pixels 310 may be repeatedly disposed in each of the second areas 2A of the display area DA in a row direction and a column direction.

That is, red-green-blue-green ("RG-BG") light emitting pixels may be repeatedly arranged in the display device 100. For example, each of the first light emitting pixels 300 and each of the second light emitting pixels 310 may have a rhombus shape in the plan view. However, the configuration of the light emitting pixels according to the present invention is not limited thereto, and in another embodiment, each of the first light emitting pixels 300 and each of the second light emitting pixels 310 may have a triangular shape, a quadrangular shape, another polygonal shape, a circular shape, or a track shape in the plan view.

In addition, although sizes of the first light emitting pixels 300 are different from each other, and sizes of the second light emitting pixels 310 are different from each other is shown in FIG. 2, the configuration of the sizes of the light emitting pixels according to the present invention is not limited thereto. For example, the first light emitting pixels 300 may have the same size and the second light emitting pixels 310 may have the same size in another embodiment.

In an embodiment, a light blocking layer BM may be disposed in each of the second areas 2A of the display area DA. That is, the light blocking layer BM surrounding the second light emitting pixels 310 may be disposed in each of the second areas 2A of the display area DA. The light blocking layer BM may not be disposed in each of the first areas 1A of the display area DA. The light blocking layer BM may be a black matrix. For example, the light blocking layer BM may include an organic light blocking material or an inorganic light blocking material including a black pigment or dye.

In an embodiment, the display device 100 may be driven in a sharing mode in which the first and second light emitting pixels 300 and 310 simultaneously emit light, or in a private mode in which only the second light emitting pixels 310 emit light. That is, in the private mode, only the second light emitting pixels 310 may emit light, and the first light emitting pixels 300 may not emit light. Accordingly, in the sharing mode, light emitted in a front direction as well as a lateral direction may be transmitted, and in the private mode, only light emitted in the front direction may be transmitted. That is, in the private mode, light emitted in the front direction may be transmitted, and light emitted in the lateral direction may be blocked by the light blocking layer BM. As used herein, the "front direction" means a normal direction of a major surface plane of the display area DA. That is, the front direction corresponds to a viewing direction of the plan view. The "lateral direction" means a direction intersecting the front direction.

In an embodiment, an area (or a size) of each second light emitting pixel 310 among the second light emitting pixels 310 may be larger than an area of each first light emitting pixel 300, emitting light of the same color as the each second light emitting pixel 310, among the first light emitting pixels 300 in the plan view. For example, an area of the second red light emitting pixel 310a among the second light emitting pixels 310 may be larger than an area of the first red light emitting pixel 301 among the first light emitting pixels 300, an area of the second green light emitting pixel 310b among the second light emitting pixels 310 may be larger than an area of the first green light emitting pixel 302 among the first light emitting pixels 300, and an area of the second blue light emitting pixel 310c among the second light emitting pixels 310 may be larger than an area of the first blue light emitting pixel 303 among the first light emitting pixels 300 in the plan view. Accordingly, the luminance lifetimes of the first and second light emitting pixels 300 and 310 may be substantially, equally maintained.

As described later, referring to FIGS. 3 and 4, a pixel defining layer PDL defining a plurality of first openings OP1 may be disposed in each of the first areas 1A of the display area DA. In addition, the pixel defining layer PDL defining a plurality of second openings OP2 may be disposed in each of the second areas 2A of the display area DA. A first light emitting layer EL1 emitting light of any one of red, green, and blue may be disposed in each of the first openings OP1. A second light emitting layer EL2 emitting light of the same color as the first light emitting layer EL1 may be disposed in each of the second openings OP2. In an embodiment, an area of each of the second openings OP2 may be larger than an area of each of the first openings OP1 in the plan view. For example, the area of the second opening OP2 in which the second light emitting layer EL2 emitting light of a first color (e.g., one of red, green, and blue) is disposed may be larger than the area of the first opening OP1 in which the first emitting layer EL1 emitting light of the first color is disposed in the plan view.

In a conventional display device, the area of each second light emitting pixel is equal to the area of each first light emitting pixel, emitting the same color as each second light emitting pixel. Since second light emitting light of pixels disposed in each of second areas of a display area always emit light (i.e., both in the sharing mode and the private mode), stress is applied to the second light emitting pixels. That is, an average light emitting time of the second light emitting pixels is longer than an average light emitting time of the first light emitting pixels. Therefore, luminance lifetimes of the first and second light emitting pixels are not equally maintained.

In the display device 100 of the present invention, the area of each second light emitting pixel 310 among the second light emitting pixels 310 disposed in each of the second areas 2A of the display area DA may be larger than the area of each first light emitting pixel 300 among the first light emitting pixels 300 and which emits light of the same color as the each second light emitting pixel and is disposed in each of the first areas 1A of the display area DA. In this case, since an average light emitting time of the second light emitting pixels 310 may be longer than an average emitting time of the first light emitting pixels 300, a current density flowing through the first areas 1A and a current density flowing through the second areas 2A may be matched equally. Accordingly, the luminance lifetimes of the first and second light emitting pixels 300 and 310 may be substantially, equally maintained.

Figure 3:
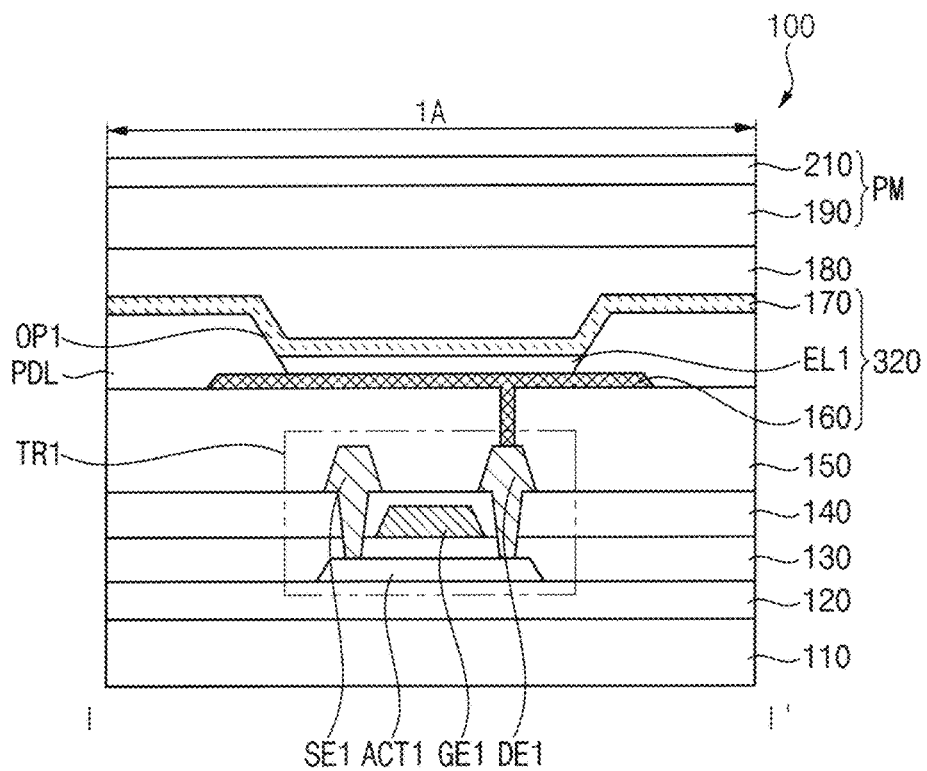
FIG. 3 is a cross-sectional view taken along line I-I' of FIG. 2.

FIG. 3 is a cross-sectional view taken along line I-I' of FIG. 2.

Referring to FIGS. 2 and 3, the display device 100 may include a substrate 110, a buffer layer 120, a first transistor TR1, a gate insulating layer 130, an interlayer insulating layer 140, a via layer 150, a pixel defining layer PDL, a first light emitting structure 320, an encapsulation layer 180, a protective member PM, and the like. The first transistor TR1 may include a first active layer ACT1, a first gate electrode GE1, a first source electrode SE1, and a first drain electrode DE1. The first light emitting structure 320 may include a first lower electrode 160, a first light emitting layer ELL and an upper electrode 170. The protective member PM may include a base adhesive layer 190 and a base layer 210. Here, the first light emitting structure 320 may define each of the first light emitting pixels 300 shown in FIG. 2.

Figure 4:
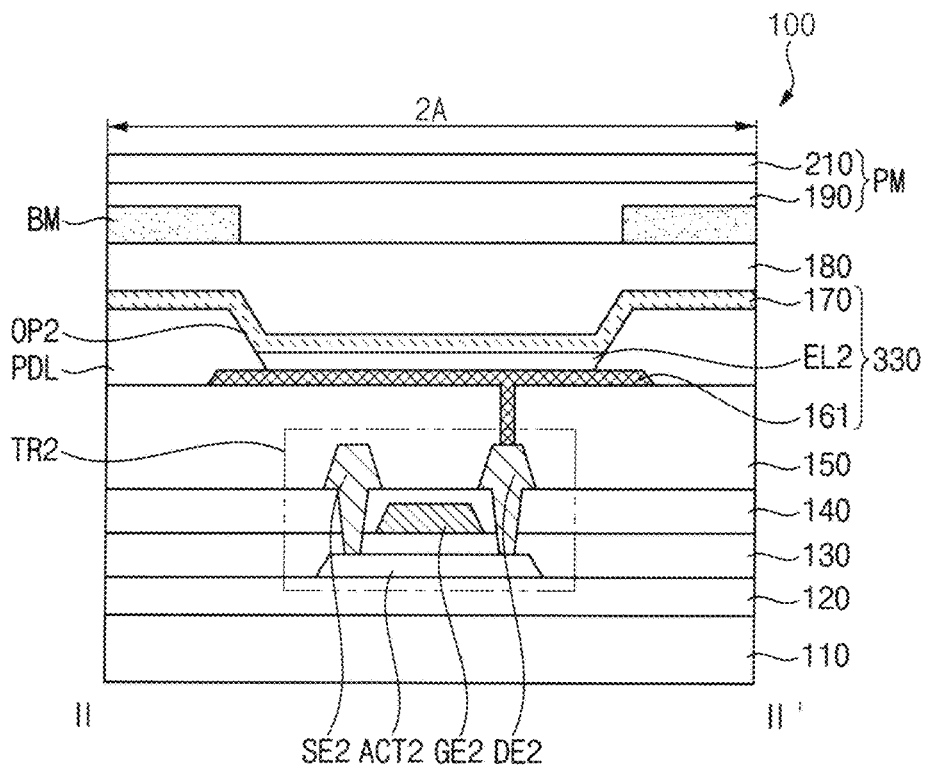
FIG. 4 is a cross-sectional view taken along line II-IP of FIG. 2.

The substrate 110 may include a first area 1A and a second area 2A (see FIGS. 3 and 4). The substrate 110 may include a transparent material or an opaque material. For example, the substrate 110 may include glass, quartz, and the like. Alternatively, the substrate 110 may include an organic insulating material such as polyimide, polycarbonate, polyethylene terephthalate, polyacrylate, and the like.

The buffer layer 120 may be disposed on the substrate 110. That is, the buffer layer 120 may be entirely disposed in the first area 1A and the second area 2A (see FIGS. 3 and 4). The buffer layer 120 may prevent diffusion of metal atoms or impurities from the substrate 110 to the first transistor TR1. For example, the buffer layer 120 may include an inorganic material such as oxide or nitride.

The first active layer ACT1 may be disposed in the first area 1A on the buffer layer 120. The first active layer ACT1 may include amorphous silicon, polycrystalline silicon, and the like. Alternatively, the first active layer ACT1 may include an oxide semiconductor.

The first active layer ACT1 may include a channel region, a source region, and a drain region. The source region and the drain region may be positioned on both sides of the channel region. For example, impurities may be doped in each of the source region and the drain region.

The gate insulating layer 130 may be disposed on the buffer layer 120. That is, the gate insulating layer 130 may be entirely disposed in the first area 1A and the second area 2A (see FIGS. 3 and 4). The gate insulating layer 130 may sufficiently cover the first active layer ACT1. For example, the gate insulating layer 130 may include silicon oxide ($SiO_x$), silicon nitride ($SiN_x$), silicon carbide ($SiC_x$), silicon oxynitride ($SiO_xN_y$), and the like.

The first gate electrode GE1 may be disposed in the first area 1A on the gate insulating layer 130. The first gate electrode GE1 may overlap the channel region of the first active layer ACT1 in a plan view. For example, the first gate electrode GE1 may include a conductive material such as copper (Cu), molybdenum (Mo), titanium (Ti), aluminum (Al), and the like.

The interlayer insulating layer 140 may be disposed on the gate insulating layer 130. That is, the interlayer insulating layer 140 may be entirely disposed in the first area 1A and the second area 2A (see FIGS. 3 and 4). The interlayer insulating layer 140 may sufficiently cover the first gate electrode GE1. For example, the interlayer insulating layer 140 may include silicon oxide, silicon nitride, silicon carbide, silicon oxynitride, and the like.

The first source electrode SE1 and the first drain electrode DE1 may be disposed in the first area 1A on the interlayer insulating layer 140. Each of the first source electrode SE1 and the first drain electrode DE1 may be connected to the source region and the drain region of the first active layer ACT 1 through a contact hole defined by removing a portion of the gate insulating layer 130 and the interlayer insulating layer 140. For example, each of the first source electrode SE1 and the first drain electrode DE1 may include a conductive material such as copper (Cu), molybdenum (Mo), titanium (Ti), aluminum (Al), and the like.

The via layer 150 may be disposed on the interlayer insulating layer 140. That is, the via layer 150 may be entirely disposed in the first area 1A and the second area 2A (see FIGS. 3 and 4). The via layer 150 may sufficiently cover the first source electrode SE1 and the first drain electrode DE1. The via layer 150 may include an inorganic insulating material and/or an organic insulating material. For example, the via layer 150 may include an inorganic insulating material such as silicon oxide, silicon nitride, silicon oxynitride, and the like and/or an organic insulating material such as acrylic resin, epoxy resin, phenol resin, polyamide resin, polyimide resin, unsaturated polyester, polyphenylene resin, polyphenylene sulfide resin, benzocyclobutene, and the like.

The first lower electrode 160 may be disposed in the first area 1A on the via layer 150. The first lower electrode 160 may be connected to the first drain electrode DE1 through a contact hole defined by removing a portion of the via layer 150. That is, the first lower electrode 160 may be electrically connected to the first drain electrode DE1 through the contact hole. For example, the first lower electrode 160 may include a transparent conductive layer including indium-tin-oxide ("ITO"), indium-zinc-oxide ("IZO"), zinc oxide (ZnO), indium oxide ($In_2O_3$), or the like and a reflective conductive layer including silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or the like.

The pixel defining layer PDL may be disposed on the via layer 150. That is, the pixel defining layer PDL may be disposed in each of the first area 1A and the second area 2A (see FIGS. 3 and 4). For example, the pixel defining layer PDL may include an organic insulating material. In an embodiment, the pixel defining layer PDL may have a first opening OP1 exposing a portion of the first lower electrode 160. The first openings OP1 may be in a plural number (see FIGS. 2 and 3).

The first light emitting layer EL1 may be disposed in the first area 1A on the first lower electrode 160. That is, the first light emitting layer EL1 may be disposed in the first opening OP1 of the pixel defining layer PDL. The first light emitting layer EL1 may have a multi-layered structure including an organic light emitting layer ("EML"), a hole injection layer ("HIL"), a hole transport layer ("HTL"), an electron transport layer ("ETL"), and/or an electron injection layer ("EIL"). The organic light emitting layer of the first light emitting layer EL1 may be formed using a light emitting material capable of emitting red light. Alternatively, the organic light emitting layer of the first light emitting layer EL1 may be formed using at least one of light emitting materials capable of emitting green light and blue light. For example, the organic light emitting layer may include a low molecular weight organic compound or a high molecular weight organic compound.

The upper electrode 170 may be disposed on the pixel defining layer PDL and the first light emitting layer EL1. That is, the upper electrode 170 may be entirely disposed in the first area 1A and the second area 2A (see FIGS. 3 and 4). For example, the upper electrode 170 may include a conductive layer including lithium (Li), calcium (Ca), aluminum (Al), magnesium (Mg), silver (Ag), platinum (Pt), lead (Pb), nickel (Ni), gold (Au), neodymium (Nd), iridium (Ir), chromium (Cr), barium (Ba), and the like.

The encapsulation layer 180 may be disposed on the upper electrode 170. That is, the encapsulation layer 180 may be entirely disposed in the first area 1A and the second area 2A (see FIGS. 3 and 4). The encapsulation layer 180 may have a stacked structure of an inorganic layer and an organic layer. For example, the organic layer may include a cured polymer such as polyacrylate ("PAR"). For example, the inorganic layer may include silicon oxide, silicon nitride, silicon carbide, aluminum oxide ($AlO_x$), tantalum oxide ($TaO_x$), hafnium oxide ($HfO_x$), zirconium oxide ($ZrO_x$), titanium oxide ($TiO_x$), and the like. Alternatively, the encapsulation layer 180 may include glass, quartz, and the like.

The protection member PM may be disposed on the encapsulation layer 180. The protection member PM may be a support body that supports the display device 100. Alternatively, the protection member PM may be a window member that protects the display device 100. As described above, the protective member PM may include the base adhesive layer 190 and the base layer 210.

The base adhesive layer 190 may be disposed on the encapsulation layer 180. That is, a lower surface of the base adhesive layer 190 and an upper surface of the encapsulation layer 180 may be contact with each other. For example, the base adhesive layer 190 may be a transparent adhesive layer. The base layer 210 may be disposed on the base adhesive layer 190. The base layer 210 may include a glass substrate or a plastic substrate. Alternatively, the base layer 210 may include a film layer formed of or including a polymer material.

FIG. 4 is a cross-sectional view taken along line II-IP of FIG. 2.

Referring to FIGS. 3 and 4, the display device 100 may include the substrate 110, the buffer layer 120, the gate insulating layer 130, the interlayer insulating layer 140, a second transistor TR2, the via layer 150, the pixel defining layer PDL, a second light emitting structure 330, the encapsulation layer 180, the light blocking layer BM, the protective member PM, and the like. The second transistor TR2 may include a second active layer ACT2, a second gate electrode GE2, a second source electrode SE2, and a second drain electrode DE2. The second light emitting structure 330 may include a second lower electrode 161, a second light emitting layer EL2, and an upper electrode 170. The protective member PM may include the base adhesive layer 190 and the base layer 210. Here, the second light emitting structure 330 may define each of the second light emitting pixels 310 shown in FIG. 2. However, the cross-sectional view of the display device 100 of FIG. 4 may be substantially the same as that of the display device 100 described in FIG. 3 except that the light blocking layer BM is further included. Hereinafter, the light blocking layer BM will be mainly described.

In an embodiment, the light blocking layer BM may be disposed in the second area 2A on the encapsulation layer 180. That is, the light blocking layer BM may not be disposed in the first area 1A on the encapsulation layer 180, and the light blocking layer BM may be disposed only in the second area 2A on the encapsulation layer 180. The light blocking layer BM may be a black matrix. For example, the light blocking layer BM may include an organic light blocking material or an inorganic light blocking material including a black pigment or dye.

As described above, the light blocking layer BM may block light directed to a lateral direction among the light emitted from the second light emitting layer EL2.

Figure 5:
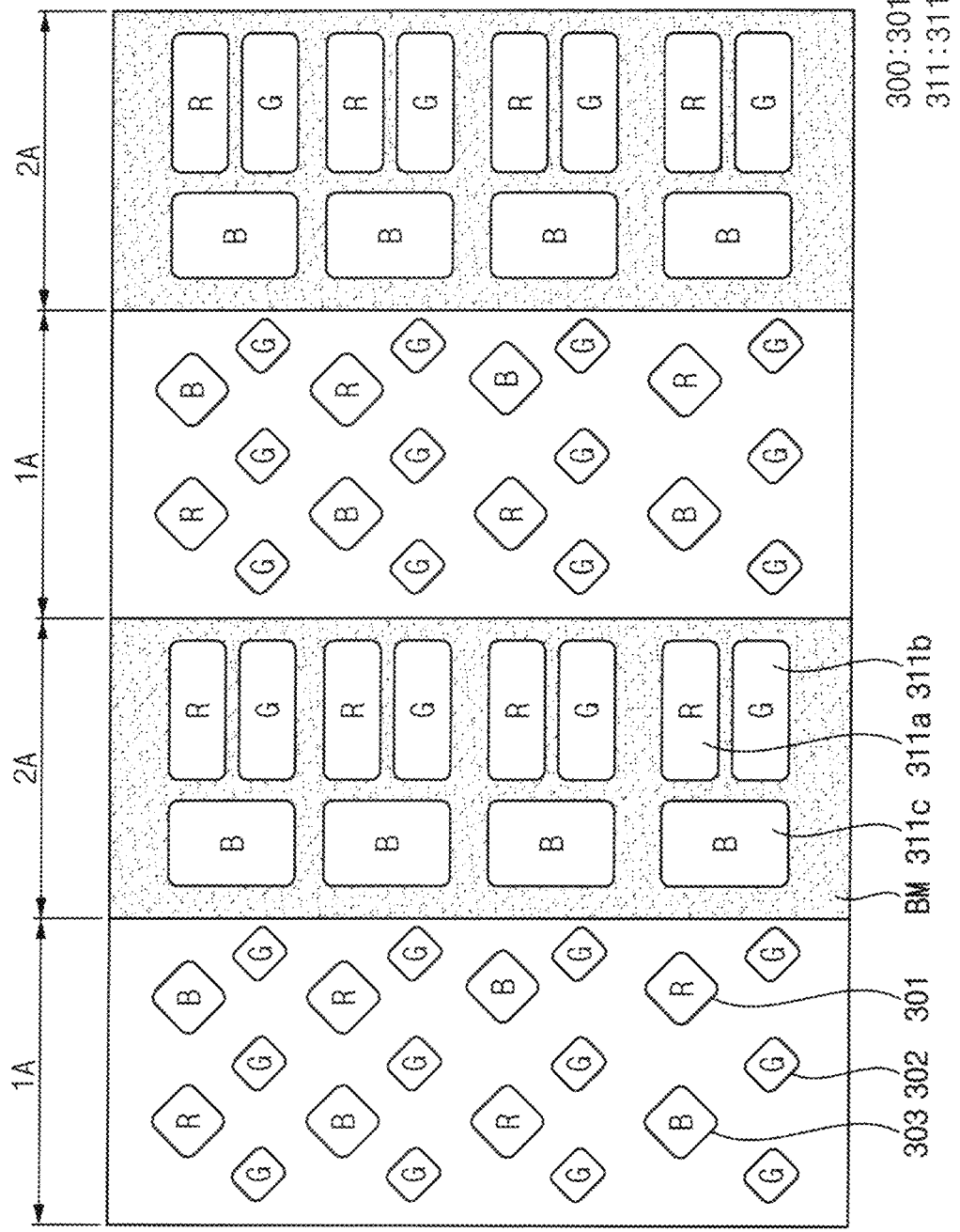
FIG. 5 is a plan view illustrating a display area of a display device according to another embodiment.

FIG. 5 is a plan view illustrating a display area of a display device according to another embodiment.

Referring to FIG. 5, the plurality of first light emitting pixels 300 may be disposed in each of the first areas 1A of the display area DA, and a plurality of second light emitting pixels 311 may be disposed in each of the second areas 2A of the display area DA. However, the display device of FIG. 5 may be substantially the same as the display device 100 described in FIG. 2 except for a shape of each of the second light emitting pixels 311. Hereinafter, the shape of each of the second light emitting pixels 311 will be mainly described.

A shape of each of the first light emitting pixels 300 and a shape of each of the second light emitting pixels 311 may be different from each other. In an embodiment, each of the second light emitting pixels 311 may have a rectangular shape. That is, each of the first light emitting pixels 300 may have a rhombus shape, and each of the second light emitting pixels 311 may have a rectangular shape.

The second light emitting pixels 311 may include at least one second red light emitting pixels 311a that emit red light, at least one second green light emitting pixels 311b that emit green light, and at least one second blue light emitting pixels 311c that emit blue light.

In an embodiment, the second light emitting pixels 311 may be disposed using an S-stripe method including the second blue light emitting pixel 311c having a relatively large area. For example, the second blue light emitting pixels 311c among the second light emitting pixels 311 may be disposed in a first column of the second area 2A, and the second red light emitting pixels 311a and the second green light emitting pixels 311b among the second light emitting pixels 311 may be alternately disposed in a second column of the second area 2A.

Figure 6:
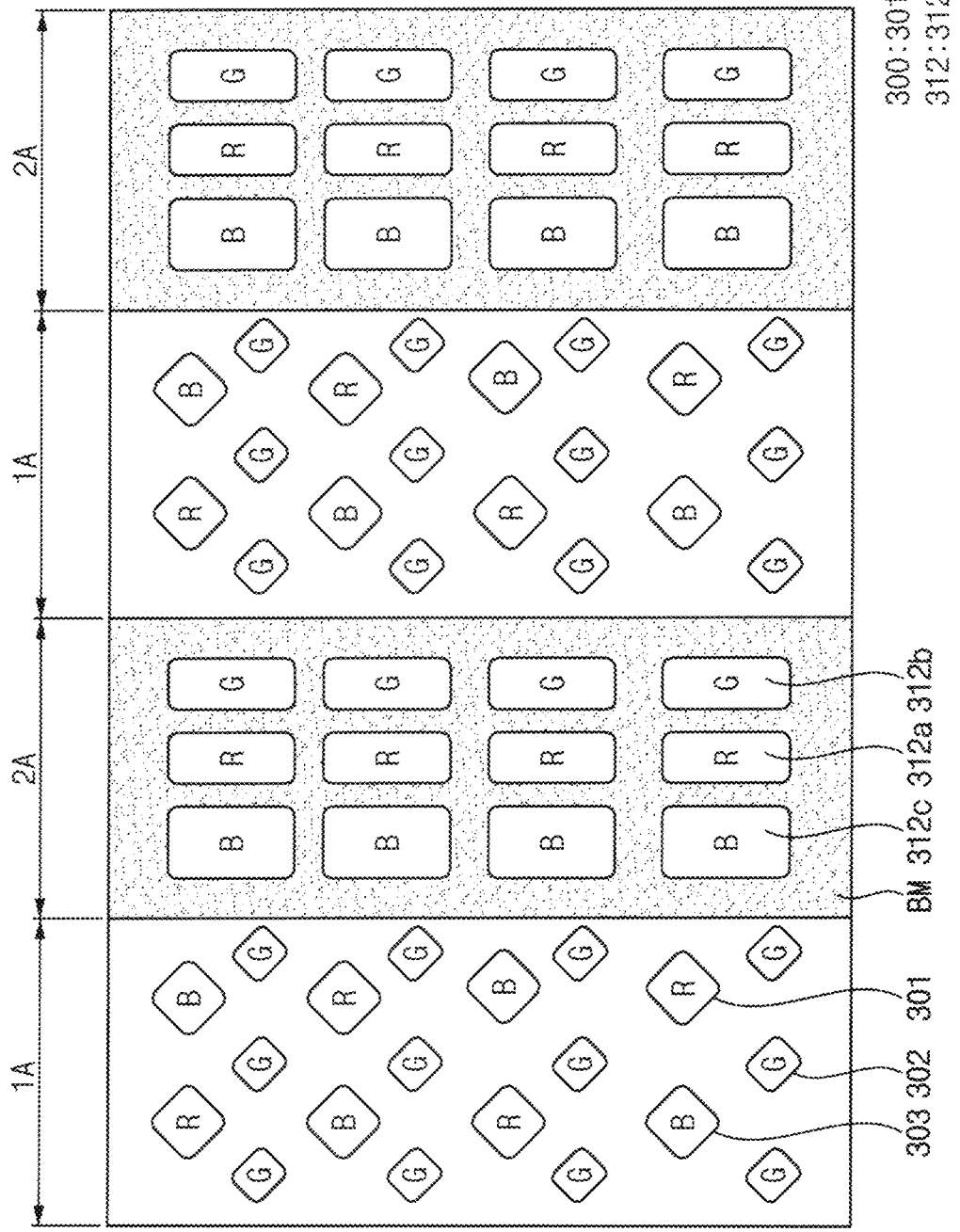
FIG. 6 is a plan view illustrating a display area of a display device according to still another embodiment.

FIG. 6 is a plan view illustrating a display area of a display device according to still another embodiment.

Referring to FIG. 6, the plurality of first light emitting pixels 300 may be disposed in each of the first areas 1A of the display area DA, and a plurality of second light emitting pixels 312 may be disposed in each of the second areas 2A of the display area DA. However, the display device of FIG. 6 may be substantially the same as the display device 100 described in FIG. 2 except for a shape of each of the second light emitting pixels 312. Hereinafter, the shape of each of the second light emitting pixels 312 will be mainly described.

A shape of each of the first light emitting pixels 300 and a shape of each of the second light emitting pixels 312 may be different from each other. In an embodiment, each of the second light emitting pixels 312 may have a rectangular shape. That is, each of the first light emitting pixels 300 may have a rhombus shape, and each of the second light emitting pixels 312 may have a rectangular shape. The second light emitting pixels 312 may include at least one second red light emitting pixels 312a that emit red light, at least one second green light emitting pixels 312b that emit green light, and at least one second blue light emitting pixels 323c that emit blue light. In an embodiment, the second light emitting pixels 312 may be disposed using an RGB-stripe method in which rectangles having the same size are sequentially disposed. For example, the second blue light emitting pixels 312c may be sequentially disposed in a first column of the second area 2A, the second red light emitting pixels 312a may be sequentially disposed in a second column of the second area 2A, and the second green light emitting pixels 312b may be sequentially disposed in a third column of the second area 2A. The second blue light emitting pixel 312c, the second red light emitting pixel 312a, and the second green light emitting pixel 312b, may be repeatedly disposed in a first row of the second area 2A, and the second blue light emitting pixel 312c, the second red light emitting pixel 312a, and the second green light emitting pixel 312b may be repeatedly disposed in a second row of the second area 2A.

Figure 7:
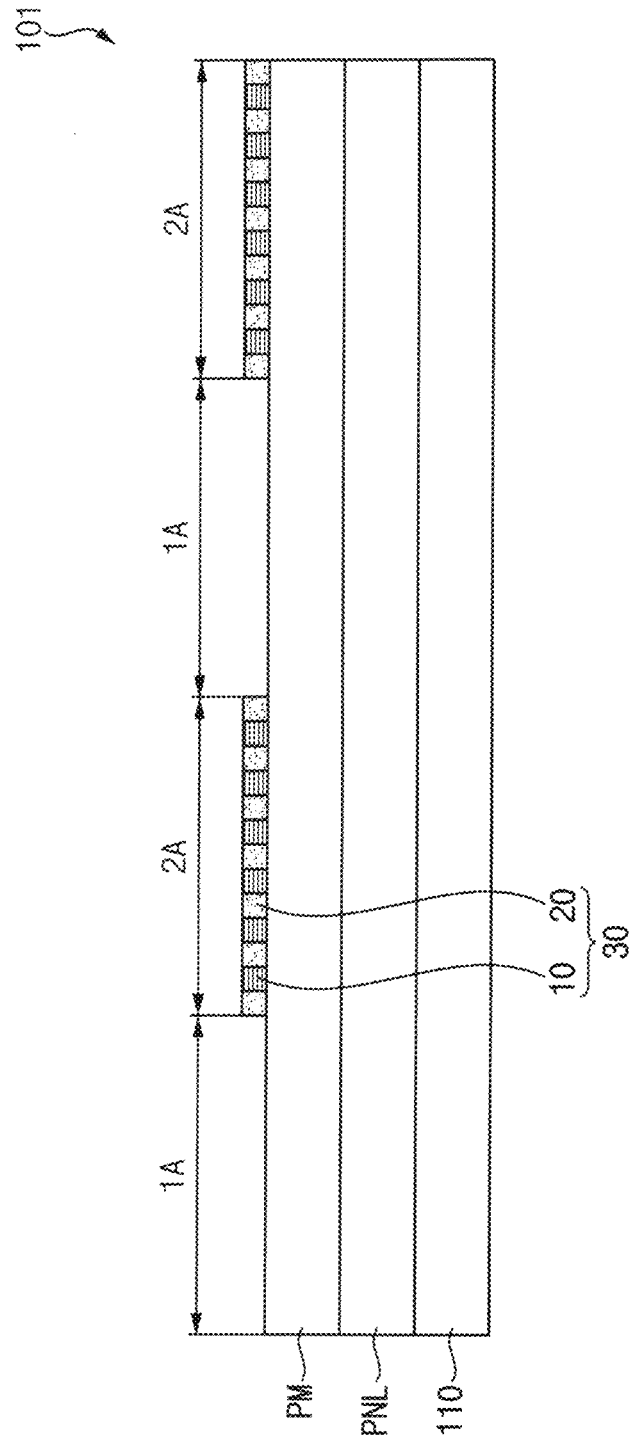
FIG. 7 is a cross-sectional view illustrating a display device according to an embodiment.

FIG. 7 is a cross-sectional view illustrating a display device according to an embodiment.

Referring to FIG. 7, the display device 101 may include the substrate 110, a display panel PNL, the protection member PM, a light blocking member 30, and the like. The display panel PNL may include the buffer layer 120, the gate insulating layer 130, the first and second transistors TR1 and TR2, the interlayer insulating layer 140, the via layer 150, the first and second light emitting structures 320 and 330, the pixel defining layer PDL, the encapsulation layer 180, and the light blocking layer BM shown in FIGS. 3 and 4. The protective member PM may include the base adhesive layer 190 and the base layer 210 shown in FIGS. 3 and 4. The display device 101 of FIG. 7 may be substantially the same as the display device 100 described with reference to FIGS. 3 and 4 except that the light blocking member 30 is further included. Hereinafter, the light blocking member 30 will be mainly described.

In an embodiment, the light blocking member 30 may be disposed on the protection member PM. The light blocking member 30 may be disposed in each of the second areas 2A on the protection member PM. The light blocking member 30 may be divided into a transmission area 20 and a blocking area 10. The transmission area 20 may transmit light in a front direction, and the blocking area 10 may block light in a lateral direction.

FIG. 7 illustrates that the light blocking member 30 is disposed only in each of the second areas 2A of the display device 101, the configuration of the present invention is not limited thereto, and the light blocking member 30 may be entirely disposed in the first areas 1A and the second areas 2A.

Figure 8:
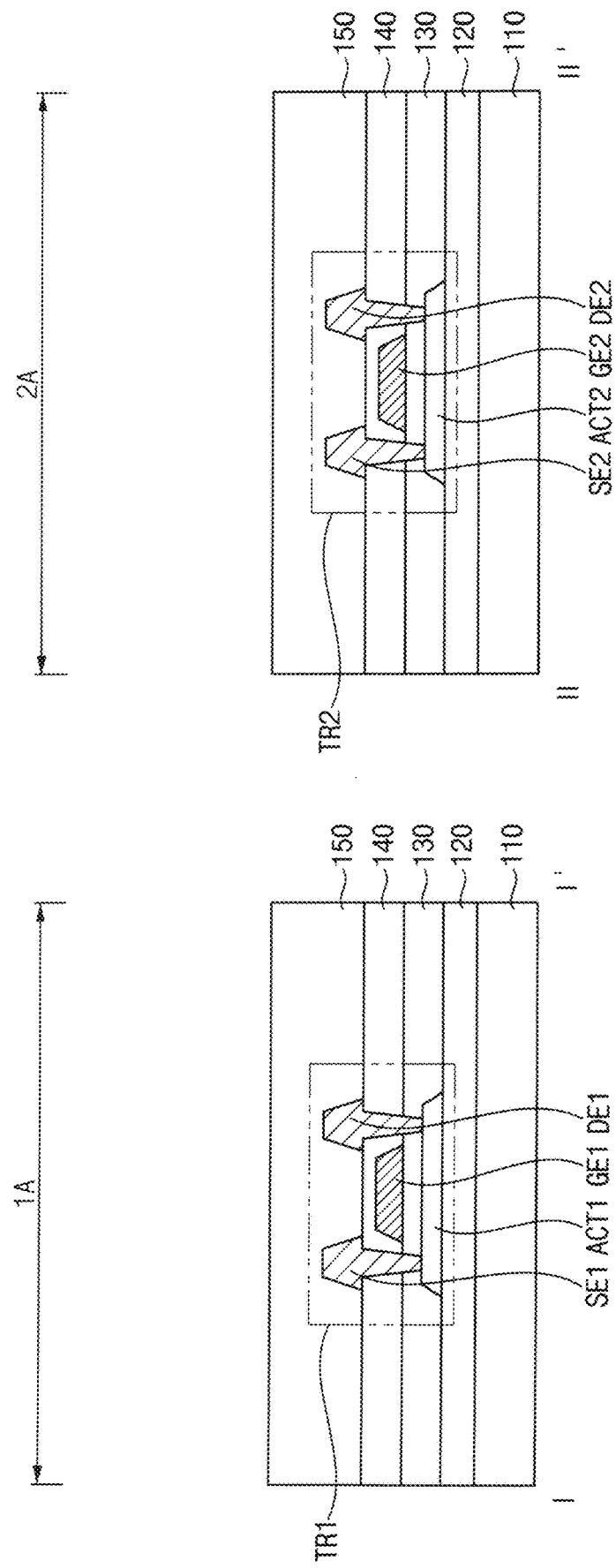
FIGS. 8, 9, and 10 are cross-sectional views illustrating a method of manufacturing a display device according to an embodiment.
Figure 9:
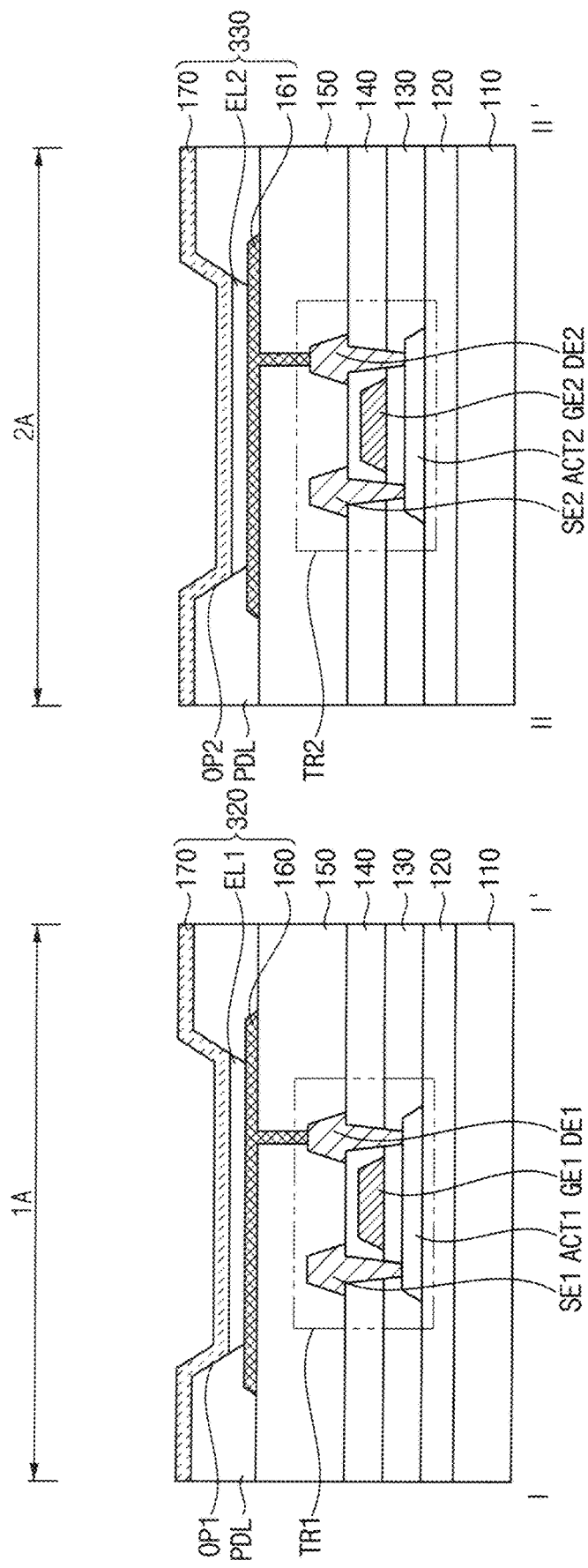
Figure 10:
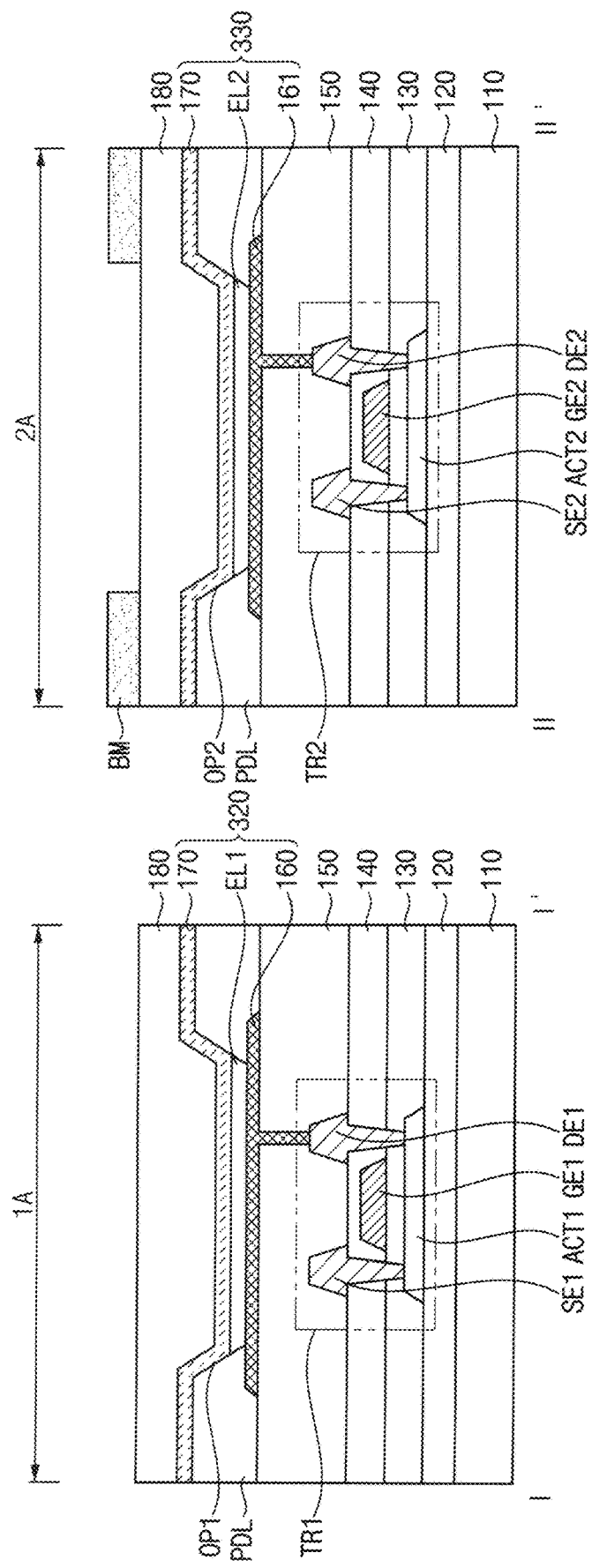

FIGS. 8, 9, and 10 are cross-sectional views illustrating a method of manufacturing a display device according to an embodiment.

Referring to FIG. 8, the substrate 110 including a transparent material or an opaque material may be provided. The substrate 110 may include the first area 1A and the second area 2A. The buffer layer 120 may be disposed on the substrate 110. That is, the buffer layer 120 may be entirely disposed in the first area 1A and the second area 2A. For example, the buffer layer 120 may include an inorganic material such as oxide or nitride.

The first active layer ACT1 may be disposed in the first area 1A on the buffer layer 120. The second active layer ACT2 may be disposed in the second area 2A on the buffer layer 120. Each of the first active layer ACT1 and the second active layer ACT2 may include amorphous silicon, polycrystalline silicon, and the like. Alternatively, each of the first and second active layers ACT1 and ACT2 may include an oxide semiconductor.

The gate insulating layer 130 may be disposed on the buffer layer 120. That is, the gate insulating layer 130 may be entirely disposed in the first area 1A and the second area 2A. The gate insulating layer 130 may sufficiently cover the first active layer ACT1 and the second active layer ACT2. For example, the gate insulating layer 130 may include silicon oxide, silicon nitride, and the like.

The first gate electrode GE1 may be disposed in the first area 1A on the gate insulating layer 130. The second gate electrode GE2 may be disposed in the second area 2A on the gate insulating layer 130. The first gate electrode GE1 may overlap the first active layer ACT. The second gate electrode GE2 may overlap the second active layer ACT2 in a plan view. For example, each of the first gate electrode GE1 and the second gate electrode GE2 may include a metal, an alloy, a metal nitride, a conductive metal oxide, a transparent conductive material, and the like.

The interlayer insulating layer 140 may be disposed on the gate insulating layer 130. That is, the interlayer insulating layer 140 may be entirely disposed in the first area 1A and the second area 2A. The interlayer insulating layer 140 may sufficiently cover the first gate electrode GE1 and the second gate electrode GE2. For example, the interlayer insulating layer 140 may include silicon oxide, silicon nitride, and the like.

The first source electrode SE1 and the first drain electrode DE1 may be disposed in the first area 1A on the interlayer insulating layer 140. Each of the first source electrode SE1 and the first drain electrode DE1 may be connected to the first active layer ACT1 through a contact hole defined by removing a portion of the gate insulating layer 130 and the interlayer insulating layer 140. In addition, the second source electrode SE2 and the second drain electrode DE2 may be disposed in the second area 2A on the interlayer insulating layer 140. Each of the second source electrode SE2 and the second drain electrode DE2 may be connected to the second active layer ACT2 through a contact hole defined by removing a portion of the gate insulating layer 130 and the interlayer insulating layer 140. For example, each of the first and second source electrodes SE1 and SE2 and each of the first and second drain electrodes DE1 and DE2 may include a metal, an alloy, a metal nitride, a conductive metal oxide, a transparent conductive material, and the like.

The via layer 150 may be disposed on the interlayer insulating layer 140. That is, the via layer 150 may be entirely disposed in the first area 1A and the second area 2A. For example, the via layer 150 may include an inorganic insulating material and/or an organic insulating material.

Referring to FIG. 9, the first lower electrode 160 may be disposed in a first area 1A on the via layer 150. The second lower electrode 161 may be disposed in a second area 2A on the via layer 150. Each of the first lower electrode 160 and the second lower electrode 161 may be connected to the first drain electrode DE1 and the second drain electrode DE2 through a contact hole defined by removing a portion of the via layer 150. For example, each of the first lower electrode 160 and the second lower electrode 161 may include a transparent conductive layer including ITO, IZO, ZnO, $In_2O_3$, and the like and a reflective conductive layer including Ag, Mg, Al, Pt, Pb, Au, Ni, Nd, Ir, Cr, Li, Ca, and the like.

The pixel defining layer PDL may be disposed on the via layer 150. That is, the pixel defining layer PDL may be disposed in the first area 1A and the second area 2A.

In an embodiment, the pixel defining layer PDL may have a first opening OP1 exposing a portion of the first lower electrode 160 in the first area 1A, and may have a second opening OP2 exposing a portion of the second lower electrode 161 in the second area 2A. For example, the pixel defining layer PDL may include an organic insulating material.

The first light emitting layer EL1 may be disposed on the first lower electrode 160, and the second light emitting layer EL2 may be disposed on the second lower electrode 161. That is, the first light emitting layer EL1 may be disposed in the first opening OP1 of the pixel defining layer PDL, and the second light emitting layer EL2 may be disposed in the second opening OP2 of the pixel defining layer PDL.

The upper electrode 170 may be disposed on the pixel defining layer PDL, the first light emitting layer ELL and the second light emitting layer EL2. That is, the upper electrode 170 may be entirely disposed in the first area 1A and the second area 2A. For example, the upper electrode 170 may include a conductive layer including Li, Ca, Al, Mg, Ag, Pt, Pb, Ni, Au, Nd, Ir, Cr, Ba, and the like.

Referring to FIG. 10, the encapsulation layer 180 may be disposed on the upper electrode 170. That is, the encapsulation layer 180 may be entirely disposed in the first area 1A and the second area 2A. The encapsulation layer 180 may have a stacked structure of an inorganic layer and an organic layer. Alternatively, the encapsulation layer 180 may include glass, quartz, and the like.

The light blocking layer BM may be disposed in the second area 2A on the encapsulation layer 180. That is, the light blocking layer BM may not be disposed in the first area 1A on the encapsulation layer 180, and the light blocking layer BM may be disposed only in the second area 2A on the encapsulation layer 180. The light blocking layer BM may overlap the pixel defining layer PDL in a plan view.

Referring again to FIGS. 3 and 4, the protection member PM may be disposed on the encapsulation layer 180. That is, the protection member PM may be entirely disposed in the first area 1A and the second area 2A.

Accordingly, the display device 100 shown in FIG. 1 may be manufactured.

The present invention may be applied to various display devices including a display device. For example, the present invention may be applicable to numerous display devices such as display devices for vehicles, ships and aircraft, portable communication devices, display devices for exhibition or information transfer, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate including a plurality of first areas and a plurality of second areas adjacent to the first areas;
   a plurality of first light emitting structures disposed in each of the plurality of first areas on the substrate and defining a plurality of first light emitting pixels in a plan view, wherein each of the plurality of first light emitting structures includes a first lower electrode, a first upper electrode disposed on the first lower electrode, and a first light emitting layer disposed between the first lower electrode and the first upper electrode;
   a plurality of second light emitting structures disposed in each of the plurality of second areas on the substrate and defining a plurality of second light emitting pixels in the plan view, wherein each of the plurality of second light emitting structures includes a second lower electrode, a second upper electrode disposed on the second lower electrode, and a second light emitting layer disposed between the second lower electrode and the second upper electrode; and
   a light blocking layer disposed in each of the second areas on the substrate and surrounding the second light emitting pixels in the plan view,
   wherein an area of a second light emitting pixel among the second light emitting pixels is larger than an area of a first light emitting pixel among the first light emitting pixels and which emits light of a same color as the second light emitting pixel in the plan view.

2. The display device of claim 1, wherein the first areas and the second areas are alternately arranged in one direction.

3. The display device of claim 1, wherein each of the first and second light emitting pixels includes:
   a red light emitting pixel which emits red light;
   a green light emitting pixel which emits green light; and
   a blue light emitting pixel which emits blue light.

4. The display device of claim 1, wherein the display device is driven in a sharing mode in which the first and second light emitting pixels simultaneously emit light, or in a private mode in which the second light emitting pixels emit light.

5. The display device of claim 1, wherein the first light emitting pixels are repeatedly arranged in a row direction and a column direction, and the second light emitting pixels are repeatedly arranged in the row direction and the column direction.

6. The display device of claim 1, wherein a shape of each of the first light emitting pixels and a shape of each of the second light emitting pixels are the same in the plan view.

7. The display device of claim 6, wherein each of the first and second light emitting pixels has a rhombus shape in the plan view.

8. The display device of claim 1, wherein a shape of each of the first light emitting pixels and a shape of each of the second light emitting pixels are different from each other in the plan view.

9. The display device of claim 8, wherein each of the first light emitting pixels has a rhombus shape in the plan view, and
   wherein each of the second light emitting pixels has a rectangular shape in the plan view.

10. The display device of claim 9, wherein second blue light emitting pixels among the second light emitting pixels and which emit blue light are disposed in a first column of each of the second areas in the plan view, and
    wherein second red light emitting pixels which emit red light and second green light emitting pixels which emit green light, among the second light emitting pixels, are alternately disposed in a second column of each of the second areas in the plan view.

11. The display device of claim 9, wherein each of the second light emitting pixels has a same-sized rectangular shape, and
    wherein the second light emitting pixels are sequentially arranged in one direction in the plan view.

12. The display device of claim 1, further comprising:
    an encapsulation layer disposed on the first and second upper electrodes; and
    a protective member disposed on the encapsulation layer.

13. The display device of claim 12, wherein the light blocking layer is disposed on the encapsulation layer in each of the second areas.

14. The display device of claim 12, further comprising:
    a light blocking member disposed on the protection member in each of the second areas.

15. The display device of claim 14, wherein the light blocking member is divided into a blocking area which blocks light in a lateral direction and a transmission area which transmits light in a front direction.

16. A display device comprising:
- a substrate including a plurality of first areas and a plurality of second areas adjacent to the first areas;
- a pixel defining layer disposed on the substrate and defining a plurality of first openings positioned in each of the first areas and a plurality of second openings positioned in each of the second areas; and
- a light blocking layer disposed in each of the second areas on the substrate and surrounding the second openings in a plan view,
- an area of each of the second openings is larger than an area of each of the first openings in the plan view.

17. The display device of claim 16, wherein the first areas and the second areas are alternately arranged in one direction.

18. The display device of claim 16, wherein a first light emitting layer which emits light of one of red, green, and blue lights is disposed in each of the first openings, and
wherein a second light emitting layer which emits a same color as the first light emitting layer is disposed in each of the second openings.

19. The display device of claim 18, wherein the display device is driven in a sharing mode in which the first light emitting layer and the second light emitting layer simultaneously emit light, or in a private mode in which the second light emitting layer emits light.

20. The display device of claim 16, wherein the first openings are repeatedly arranged in a row direction and a column direction, and the second openings are repeatedly arranged in the row direction and the column direction.

* * * * *